United States Patent
Takagi et al.

(10) Patent No.: US 6,587,374 B2
(45) Date of Patent: Jul. 1, 2003

(54) SERIAL STORAGE DEVICE

(75) Inventors: Hiroki Takagi, Kyoto (JP); Yoshihiro Tada, Kyoto (JP); Noriaki Katsuhara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/082,045

(22) Filed: Feb. 20, 2002

(65) Prior Publication Data

US 2002/0118567 A1 Aug. 29, 2002

(30) Foreign Application Priority Data

Feb. 26, 2001 (JP) ........................................ 2001-050131

(51) Int. Cl.[7] .............................. G11C 16/04; G11C 7/00
(52) U.S. Cl. ............................... 365/185.11; 365/189.12; 365/221
(58) Field of Search ................................ 365/219, 221, 365/185.11, 185.12, 189.12

(56) References Cited

U.S. PATENT DOCUMENTS 5,815,444 A * 9/1998 Ohta ........................... 365/221
6,034,910 A * 3/2000 Iwase .......................... 365/221
6,097,640 A * 8/2000 Fei et al. .................... 365/189.02

* cited by examiner

Primary Examiner—Son Mai
(74) Attorney, Agent, or Firm—Hogan & Hartson, LLP

(57) ABSTRACT

Memory cells of a storage device are addressed in n-bit word(s). Each of the n-bit word memory cells are partitioned into k (k≥2) groups of n/k bits. The memory cells are sequentially selected in n/k bits. Data of the selected n/k bit memory cells are read by n/k sense amplifiers and serially output from the storage device as readout data. The storage device requires much less chip area for n/k sense amplifiers and reduced peak currents in a read operation.

4 Claims, 6 Drawing Sheets

SERIAL STORAGE DEVICE

FIELD OF THE INVENTION

The invention relates to a serial storage device having a memory cell array addressable in n-bit words.

BACKGROUND OF THE INVENTION

In reading data in a serial storage device such as a video memory, the data are retrieved simultaneously from a memory cell array in sequence in a multiplicity of bits (e.g. 8-bit and 16-bit words) to store them in registers so that the stored data may be serially output subsequently therefrom by shifting them in the registers. Also in writing data, they are written to designated memory cells of the array in words.

FIG. 1 shows a structure of a conventional serial storage device utilizing an array 1 of non-volatile memory cells known as electrically erasable programmable read only memory (EEPROM).

As shown in FIG. 1, the memory array 1 has a matrix of 32 rows and 4 columns of memory cells each forming an 8-bit word. Each of the memory cells is a non-volatile memory cell such as an EEPROM. A decoder 2 is provided to select a row out of the 32 rows of the matrix using word lines WL. A selector 3 is provided to select a column out of the 4 columns of the matrix using a column selection signal YA using bit lines BL(0–31). The address of a word is thus defined by the decoder 2 and the selector 3. In this way the addressing of memory cells is performed in 8-bit words.

In the write operation, data lines DL0–DL7 receives one word data, which are then written to addressed memory cells of the array. In the read operation, data retrieved from the addressed memory cells onto the data lines DL0–DL7 are "read" by determining the potential levels ("0" or "1") of the signals on the lines by the sense amplifiers 4 associated with the respective data lines. The read data ("0"s or "1"s) are stored in a shift register 5. The data bits stored in the shift register 5 are then serially sent therefrom in synchronism with a clock (not shown) as the output data DO.

In this way, in a conventional serial storage device, read and write operations are both carried out in words. In particular, in the read/write operation to EEPROM, it is necessary to process data in words since a write to EEPROM takes a long time (as much as about 10 ms for example). Data reads are also performed in words, in harmony with the data write.

However, such word-wise processing of data read requires the same number of sense amplifiers and data lines as the number of the bits of each word. Consequently, the storage device needs a fairly large area for the required number of sense amplifiers and the data lines.

SUMMARY OF THE INVENTION

It is therefore an object of the invention to provide a serial storage device which is addressable in words by a reduced number of sense amplifiers and data lines than as required in conventional serial storage devices, to thereby reducing the dimensions and the peak currents of the storage device in operation.

In accordance with one aspect of the invention, there is provided a serial storage device, comprising:
- at least one memory cell array addressable in multiple n-bit memory cells;
- selection means for partitioning the addressed n-bit memory cells into k ($\geq 2$) groups each having n/k bits and for selecting the n/k-bit memory cell groups in sequence;
- n/k sense amplifiers for determining the n/k bit data selected by said selection means and output from said addressed memory cells; and
- a register for parallelly receiving the output of the sense amplifiers and for serially outputting them as readout data. The addressing of the memory cells of the array may be made by a row and a column selection signals.

Thus, the invention evaluates or determines the contents of each n/k-bit group of a selected n-bit (e.g. 8-bit or 16 bit) word. Accordingly, the sense amplifiers, and hence the data lines, required for the determination of the word are reduced in number by a factor of 1/k. This implies that the dimensions of the serial storage device and the peak currents thereof are reduce accordingly.

The selection means of the invention may be formed of
- a first selector for selecting from the row of memory cells selected by said row selection signal, n-bit memory cells addressed by said column selection signal; and
- a second selector for partitioning said n-bit memory cells into n/k-bit groups ($k \geq 2$) and for sequentially selecting said n/k-bit groups in sequence.

The selection means may be alternatively adapted to select from the row of memory cells selected by said row selection signal n-bit memory cells addressed by said column selection signal, further partition said n-bit memory cells into k groups of n/k bits and sequentially selecting said k groups by a group selection signal.

In this way n/k bit memory cells may be easily selected from an addressed n-bit memory cell group.

The n/k-bit data to be output next can be selected by the second selector and determined by the n/k sense amplifiers while the register is serially outputting the readout data.

Since the next n/k bit data are determined by the sense amplifiers while the current n/k bit data are being output from the register, n-bit readout data may be serially delivered from the register continuously and without any delay.

Each of the memory cells in the memory cell array of the invention is electrically writable and erasable non-volatile memory cells. The memory array is provided with one or more common array source ground lines for each group of n-bit memory cells. The n/k bit memory cells are dispersively distributed with respect to the array source ground lines in a manner as described below.

In this distributed arrangement of the memory cells, the rise of source potential of the memory cells during a read operation caused by read currents through impedances of the diffusion layers connecting each of the memory cells with the array source ground lines is reduced. As a result, the invention attains a uniform power distribution to the memory cells, high speed read operation, and reliable operation of the sense amplifiers.

The serial storage device of the invention may include a latch adapted to sequentially latch, via the second selector, externally supplied n/k-bit data on the locations of the latch selected by the second selector, and write the latched n-bit data to the addressed locations of the memory cell array via the first selector.

Thus, the invention allows temporary storage of n-bit data in the latch 14 as the data is input in n/k bits, and writing the whole n-bit data to the memory cell array at a time, thereby carrying out write operation without spending extra time if receiving data in n/k bits. Furthermore, the write can be done using reduced numbers of sense amplifiers and data lines.

The serial storage device of the invention may be provided with a page buffer of j×n bits for storing externally supplied n/k-bit sequential data in the j ($j \geq 1$) word locations of the page buffer selected by the selection means, and for writing the whole data (j words) at a time to memory locations of the memory cell array as addressed by the selection means.

The page buffer enables quick write to the memory cell array, since the page buffer can sequentially latch therein j words (j×n bits) while receiving data in n/k bits and write the whole data to the memory cell array at a time using reduced sense amplifiers and reduce data lines. It will be appreciated that the write can be done in a still shorter time.

BRIEF DESCRIPTION OF THE DRAWINGS

The invention will now be described in detail by way of example with reference to accompanying drawings, in which.

DETAILED DESCRIPTION OF THE PREFERRED EMBODIMENT

In the invention memory cells of the memory array are addressed in n bits. Each word is partitioned into a multiplicity k of n/k-bit groups, with n and k being integers greater than 1. In retrieving data, each of the n/k-bit groups of a word are sequentially selected for the determination thereof by n/k sense amplifiers. The unitary n-bit can be a n-bit word, e.g. an 8-bit, 16-bit, and 32-bit word. The number k of the partitioned groups can be 2, 4, and 8 for example. It should be understood, however, that the values of n and k are presented for purposes of illustration and not limited to these examples described herein above. They can be chosen arbitrarily for convenience.

Figure 1:
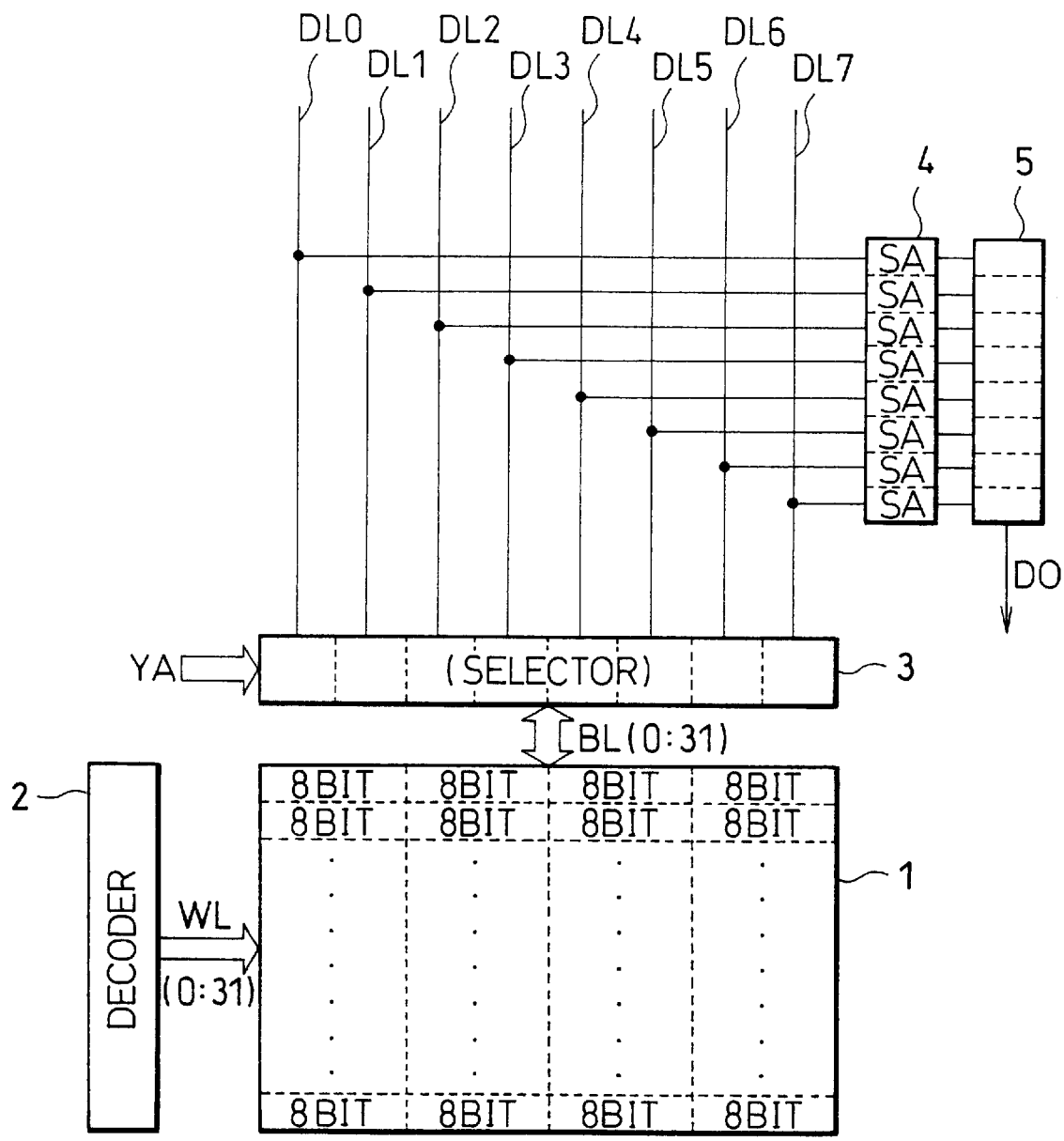
FIG. 1 is a schematic diagram of a conventional serial storage device.
Figure 2:
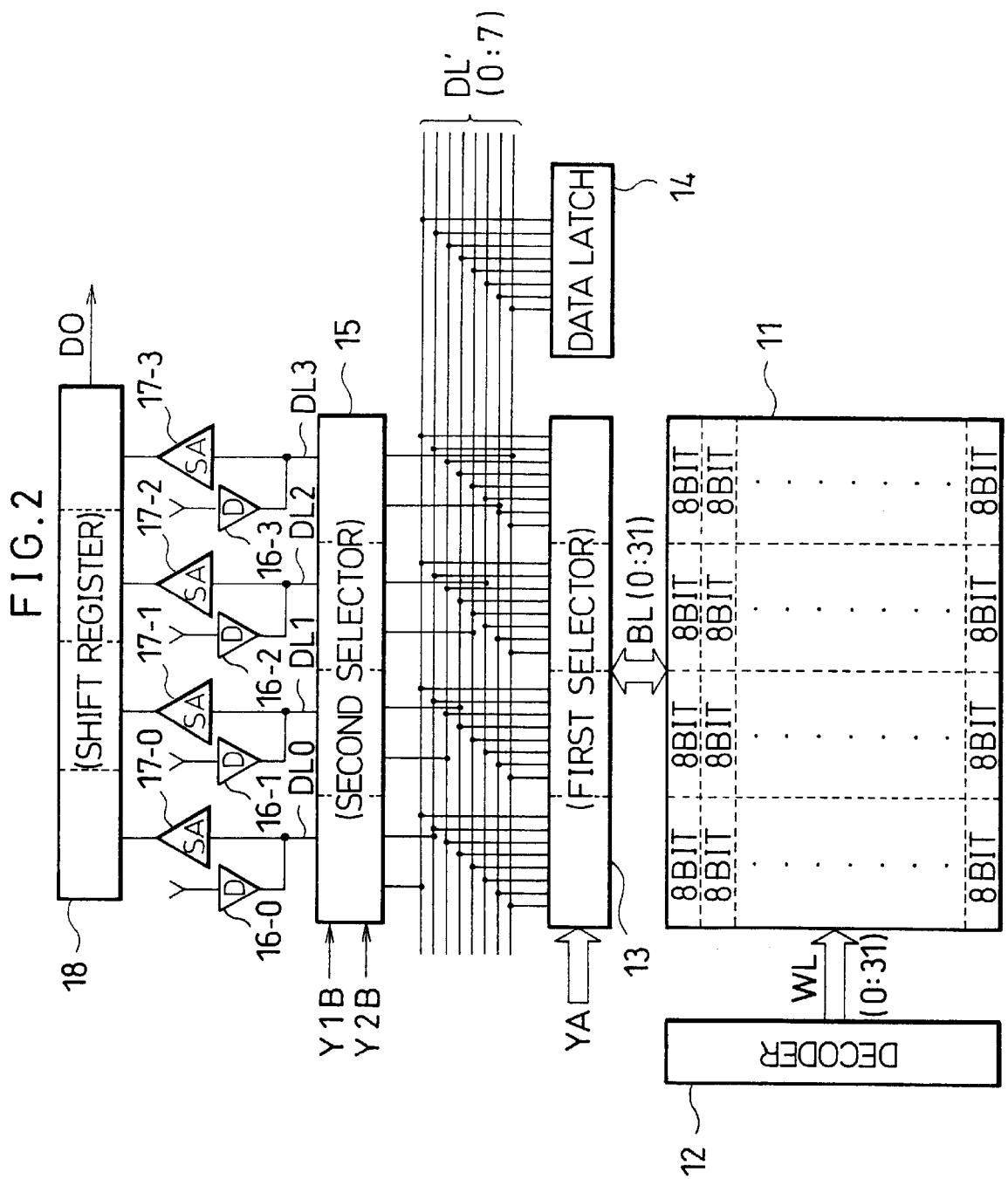
FIG. 2 is a first embodiment of a serial storage device according to the invention.
Figure 3:
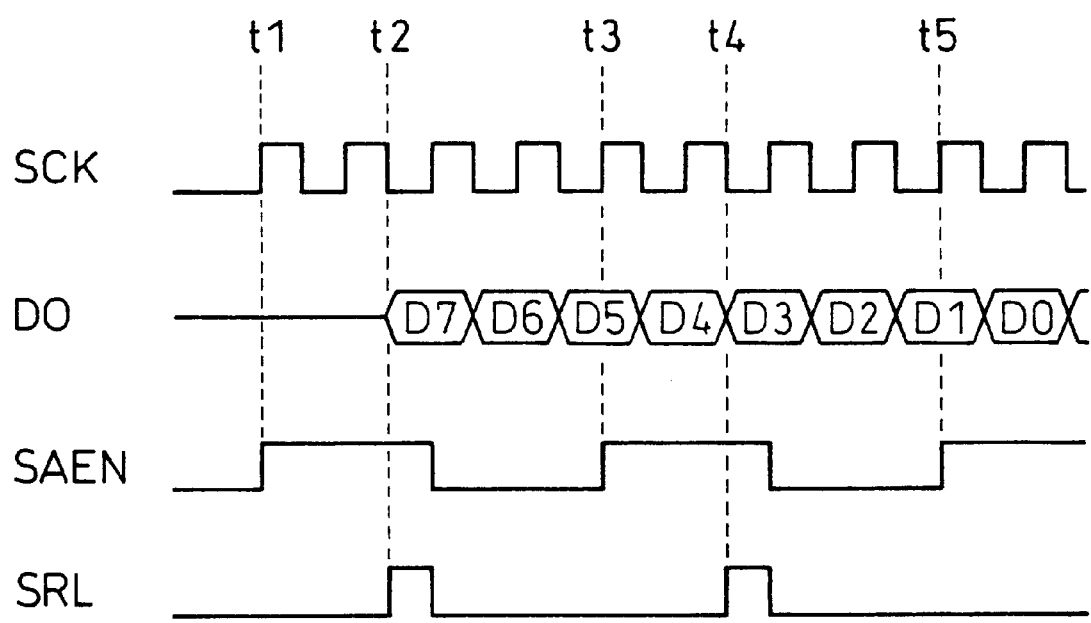
FIG. 3 illustrates a timing chart for a data read operation.

Referring to FIG. 2, there is shown schematically a structure of a first embodiment of a serial storage device according to the invention. A timing chart of a read operation by the serial storage device is shown in FIG. 3. In the example shown herein, it is assumed that n=8 and k=2.

Memory cell array 11 of FIG. 2 has non-volatile memory cells such as EEPROM cells. The memory cell array 11 is a matrix of w (32 rows)×y (4 columns) memory cells for storing four n (8)-bit words. A decoder 12 serving as a row selection means selects one row out of 32 rows using one of 32 word lines WL(0:31). A first selector 13 sequentially selects one column out of four columns based on a column selection signal YA as the signal is updated by a count signal for example. The address of each word is defined by the row specified by the decoder 12 and the column specified by the first selector 13. In this way, addressing of the memory cells of the array 11 can be performed in (8-bit) words in both of write and read operations.

The first selector 13 also selects from bit lines BL(0:31) certain bit lines associated with the selected data word, and connect the selected lines to corresponding ones of intermediate data line DL'(0:7).

A data holder 14 in the form of a latch temporarily stores 8-bit data or word during a write operation.

A second selector 15 partitions the intermediate data lines DL'(0:7) connected with the first selector 13 into two groups and connects either one of the two groups with data lines DL0–DL3 according to which of a first select signal Y1B or a second select signal Y2B is received.

Upon receipt of a half of one 8-bit word (i.e. 4-bit data) during a write operation, drivers 16-0–16-3 supply the received data to the data lines DL0–DL3.

Sense amplifiers 17-0–17-3 compare respective electric signals appearing on the data lines DL-0–DL-3 during a read operation, indicative of readout data, with reference signals to evaluate or determine the respective data ("0" or "1").

A shift register 18 holds the whole data received from the sense amplifiers 17-0–17-3 and output them as a serial data by shifting them out in response to a serial clock.

With additional reference to FIG. 3, read operation of the serial storage device will now be described. As the decoder 12 selects one of the word lines WL(0:31), a corresponding row of the memory cell array 11 is selected. The four columns of selected memory cells in the selected row are connected with the bit lines BL(0:31). In the first selector 13, a column of 8 bit cells is selected from the four columns by a column selection signal YA, which are connected with the intermediate data lines DL'. The column selection signal YA is updated by a counter to select the respective columns in sequence. Thus, one word of the memory cell array 11 is addressed by the selections made by the decoder 12 and the first selector 13.

Next, either of the first group or the second group of the intermediate data lines DL' is selectively connected to the data lines DL0–DL3, depending on which of first and second selection signals Y1B and Y2B, respectively, is received by the second selector 15.

Thus, the sense amplifiers 17-0–17-3 are connected, via the second selector 15, intermediate data lines DL' and first selector 13, with the four addressed memory cells of the memory cell array 11 associated with the word.

Under the condition, the data stored in the addressed memory cells are taken out onto the data lines DL0–DL3, and the sense amplifiers 17-0–17-3 are enabled by the sense amplifier enabling signal SAEN (at time t1) as shown in FIG. 3 to determine the levels of the signals appearing on the data lines DL0–DL3. Results of the determination, that is, result of reading, of data D4–D7 of the first group of the four memory cells belonging to the addressed word, are stored in the shift register 18 in response to a shift register latch signal SRL at time t2.

The first group of four data D4–D7 stored in the shift register 18 are sequentially read out as output data DO by a serial clock SCK.

The second group of four data lines of the intermediate data lines DL' are connected to the respective data lines DL0–DL3 while the first group of four data D4–D7 are serially read out. Hence, the sense amplifiers 17-0–17-3 are connected to the second group of four memory cells associated with the addressed word via the second selector 15, the intermediate data lines DL', and the first selector 13.

Under this conditions, the sense amplifier enabling signal SAEN is activated to enable the sense amplifiers 17-0–17-3 for determination of the signals appearing on the data lines DL0–DL3 at time t3. The results of the determinations of the second group of data D0–D3 of the second four memory cells associated with the addressed word are stored in the shift register 18 in response to the shift register latch signal SRL at time t4. In this way, when all the first group of data D7–D4 are read out of the shift register 18, the second group of data D3–D0 read out of the second group of four memory cells are stored in the shift register 18.

Thus, the four (n/k) data D3–D0 to be output next are determined by n/k sense amplifiers while outputting the data D7–D4 retrieved from the shift register 18. Hence, the entire n-bit word is serially output continuously without any delay. The next word can be processed in the same manner.

As described above, memory cells are selected in 8-bit words and data retrieved therefrom are divided into two groups for the determination thereof by only four (n/k) sense amplifiers, which requires a reduced chip area on an LSI and reduced peak currents in the sense amplifiers.

Write operation performed in the storage device will now be described. Of the data D7–D0 of one word to be written to the memory cell array, the first group of data D4–D7 are latched in the latch 14 via drivers 16-0–16-3, the second selector 15 held in the first condition by the first selection signal Y1B, and the intermediate data lines DL'. Next, the second group of data D0–D3 are latched in the latch 14 via drivers 16-0–16-3, the second selector 15 held in the second condition by the second selection signal Y2B, and the intermediate data lines DL', thereby completing latching the whole word D0–D7.

In the next step, a selection is made by the decoder 12 to choose one of the word lines WL(0:31) of the memory cell array 11. At the same time a selection is made in the first selector 13 by the column selection signal YA to choose one of the four columns. That is, one address is selected for the write. Under this condition, one word data D0–D7 latched in the latch 14 are written to the addressed locations of the memory cell array 11 via the first selector 13.

It is noted that each 8-bit word can be entered in halves but the whole word can be latched in the latch 14 and written to the memory cell array 11.

Figure 4:
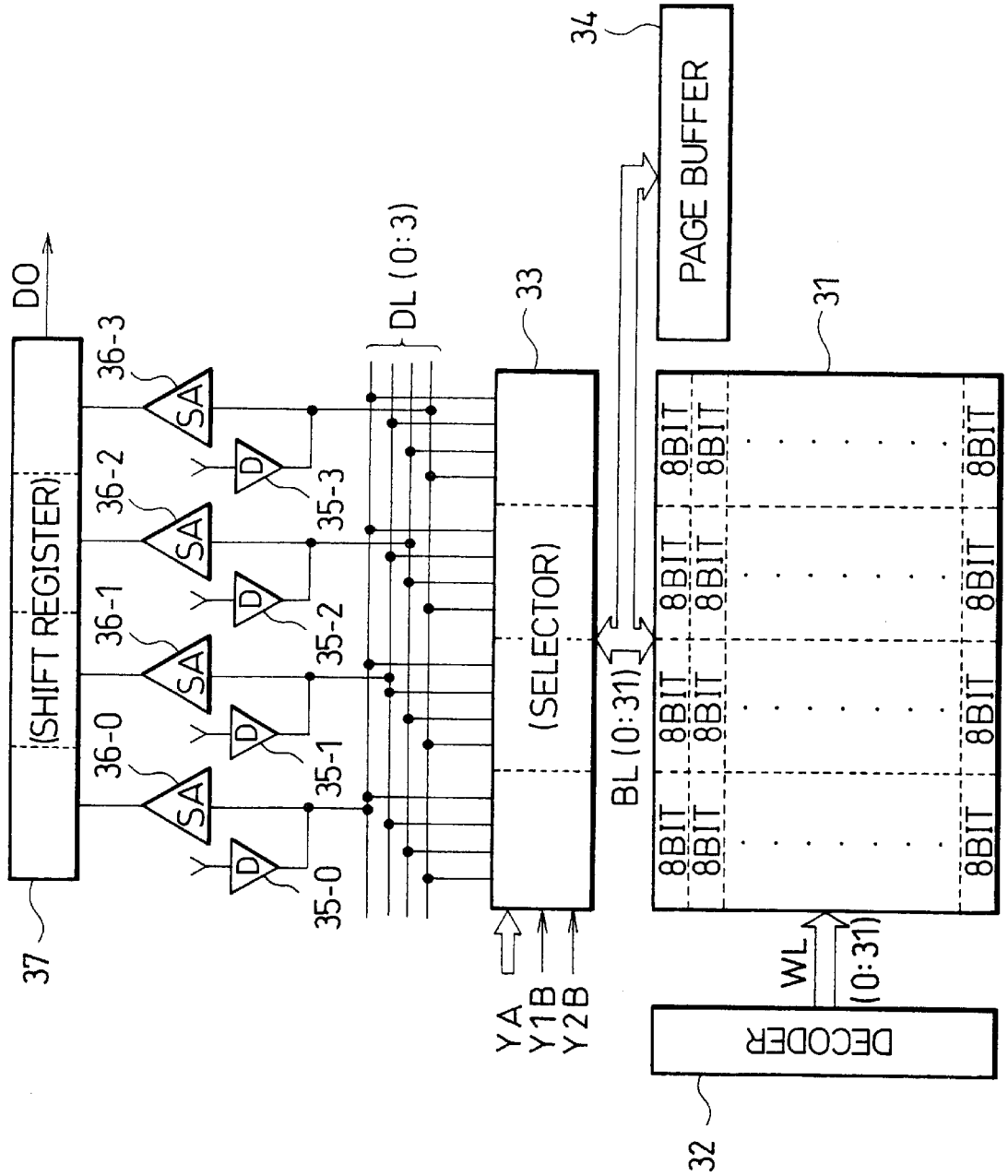
FIG. 4 is a second embodiment of a serial storage device according to the invention.

FIG. 4 shows a second structure of an embodiment of an inventive serial storage device.

This storage device has the same memory cell array 31, decoder 32, drivers 35-0–35-3, sense amplifiers 36-0–36-3, shift register 37 as those in the embodiment of FIG. 2, for which further description will be omitted.

A selector 33 is adapted to perform similar functions of the first and second selectors 13 and 15 shown in FIG. 2. The selector 33 can switch connections of the bit lines BL(0:31) and the data lines DL(0:3) based on a column selection signal YA, a first selection signal Y1B, and a second selection signal Y2B.

In other words, the selector 33 determines the address of an 8-bit word within the memory cell array 31 using a column selection signal YA and word lines WL(0:31) connected with the decoder 32. Each of the first and the second selection signal Y1B and Y2B, respectively, is a signal for partitioning the addressed word into two groups and selecting either one of them.

Figure 5:
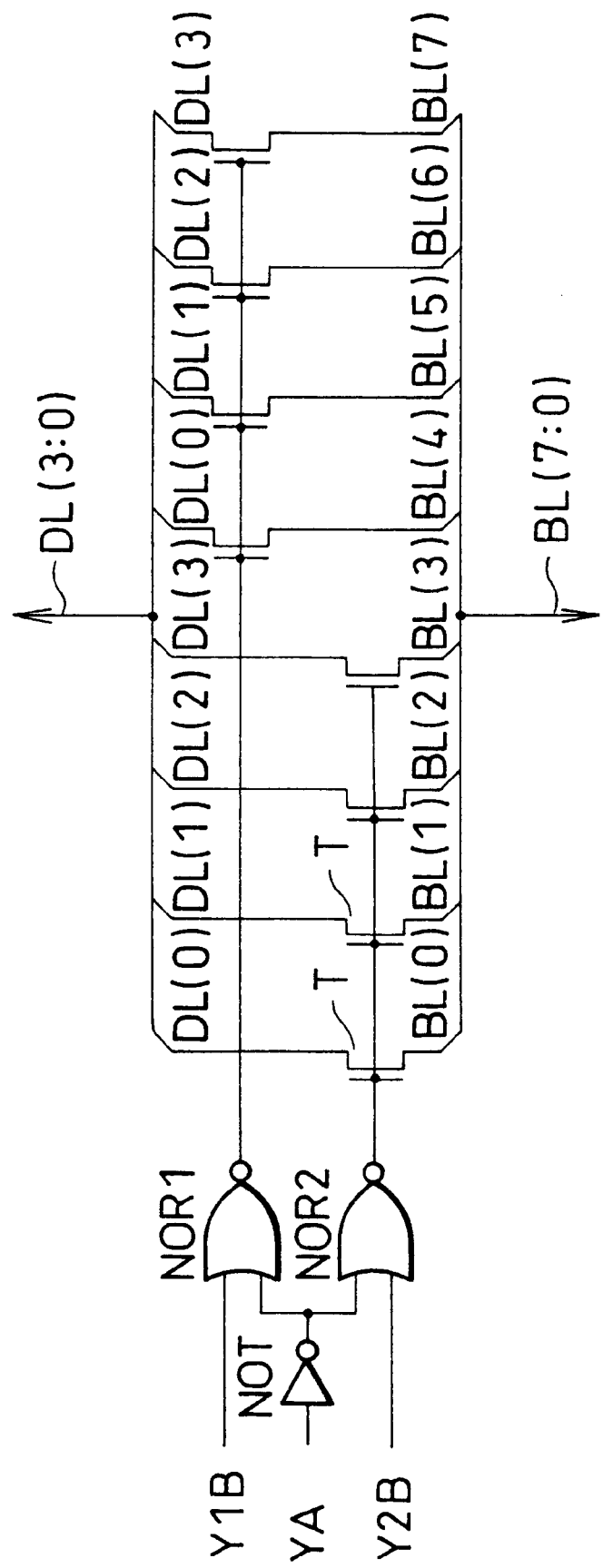
FIG. 5 shows a circuit of a selector of the serial storage device of FIG. 4.

A portion of an exemplary circuit of the selector 33 is shown in FIG. 5 in association with one of the four columns. Of the bit lines BL(7:0) of the column selected by a column selection signal YA, a first group of bit lines BL(7–4) or a second group of bit lines BL(3–0) are connected to the data lines DL(3:0) by the first selection signal Y1B or by the second selection signal Y2B. For this purpose, the circuit includes 8 MOS transistors T, a NOT-circuit NOT, and two NOR circuits NOR1 and NOR2, as shown in FIG. 5.

The page buffer 34 has a capacity for four columns of data (i.e. 4 words) belonging to one row of the memory cell array 31. The page buffer 34 is provided therein with a transfer gate for controlling input and output of data. When externally supplied data are written, the data are sequentially stored in the page buffer 34 via the selector 33. After a predetermined number of words (possibly less than 4 words) are stored in the page buffer 34, the whole words are written at a time from the buffer to the addressed row of the memory cell array 31.

Referring again to FIG. 4, the data read operation will now be described. In the first step, one word line WL(0:31) is selected by the decoder 32 for selecting one row of the memory cell array 31, so that the four columns in the selected row are connected to the bit lines BL(0:31) and to the selector 33. In the selector 33, one of the four 8-bit columns is selected by the column selection signal YA to address one word in the memory cell array 31. The column selection signal YA is updated by a count signal for example for sequential selection of the columns. Then either the first or the second group of four bit lines of the selected bit lines BL are selectively connected with the data lines DL0–DL3 by either selection signal Y1B or Y2B.

Thus, the sense amplifiers 36-0–36-3 are connected via the selector 33 to the four memory cells of the addressed word in the memory cell array 31.

Under this condition, data of the addressed memory cells are retrieved, and then a sense amplifier enable signal is activated to enable the sense amplifiers 36-0–36-3 to determine the levels of the signals appearing on the data lines DL0–DL3. The determinations of the first group of four data D7–D4 read out of the memory cells are stored in the shift register 37 by the shift register latch signal.

The four data D7–D4 stored in the shift register 37 are read out in sequence by a serial clock, and output as the output data DO.

While the first group of four data D7–D4 are serially read out, the second group of four bit lines are selected by the selector 33 based on the second selection signal Y2B, thereby connecting the second group of four bit lines with the data lines DL0–DL3. Thus, the sense amplifiers 36-0–36-3 are connected via the selector 33 with the second group of four memory cells of the addressed word in the memory cell array 31.

Under this condition, while data D7–D4 are serially read out from the shift register 37, four (or n/k) data D3–D0 to be output next are determined by the sense amplifiers 36-0–36-3 in the timing as shown in FIG. 3. Consequently, a whole word is serially output continuously out of the memory cell array 31, and the next word is retrieved in the same manner without delay.

The write operation will now be described. In the first step, the selector 33 is set to a first condition by the driver 35-0–35-3, column selection signal YA, and the first selection signal Y1B, where the first group of four data D7–D4 of the word data D7–D0 are stored in the page buffer 34 via the selector 33. In the next step, the selector 33 is set to a second condition by the driver 35-0–35-3, column selection signal YA, and the second select signal Y2B, where the second group of four data D3–D0 are stored in the page buffer 34 via the selector 33. At the end of this step, the whole word has been stored in the page buffer 34. The second, third, and fourth words are subsequently stored in turn as needed.

Next, the decoder 32 selects one of the word lines WL(0:31) of the memory cell array 31. Under this condition, the data for the four words stored in the page buffer 34 are written to the memory cells of the memory cell array 31 associated with the word line.

Thus, as in the first embodiment, read operation can be performed by a reduced number of the sense amplifiers, thereby minimizing the dimensions of the serial storage device, and hence the LSI chip therefor, and reducing the peak currents in the sensing operations.

It is noted that in this embodiment, although each of the 8-bit words input is split into two halves, the page buffer stores four words so that they can be written to the addressed locations of the memory cell array 31 at a time.

Figure 6:
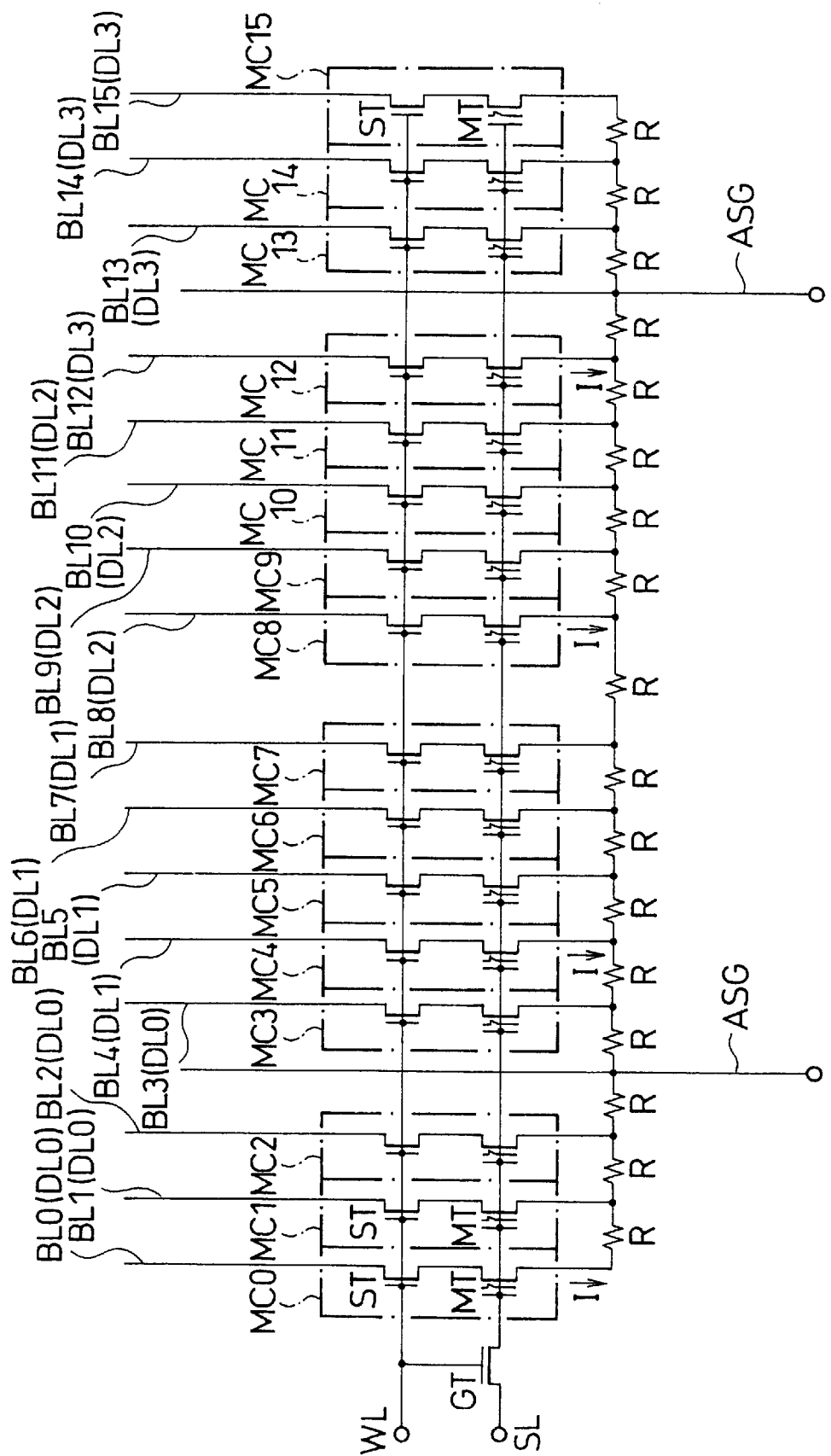
FIG. 6 is a third embodiment of a serial storage device according to the invention.

FIG. 6 illustrates a third embodiment of a serial storage device of the invention, showing a portion of the memory cell array of the storage device. This embodiment has a feature that the memory cell array is configured such that memory cells belonging to an n(8)-bit word are selected in n/k bits, with $k \geq 2$. In the example shown herein, one word is formed of 16 bits (n=16), and each word is partitioned into four (k=4) groups.

Each of memory cells MC0–MC15 is formed of a memory transistor MT and a serial selection transistor ST connected at one end thereof with one end of the memory transistor MT, as shown in FIG. 6. The memory transistor MT is a well known non-volatile writable and erasable EEPROM memory, which has a floating gate and a control gate.

The gates of the selection transistors ST are connected with a word line WL, while the control gates of the memory transistors MT are connected with a sense line SL via a gate transistor GT which is driven by the word line WL.

The memory cells MC0–MC15 are provided with respective bit lines BL0–BL15, which are located above the respective memory cells for connection with the other ends of the respective selection transistors ST. Arranged between the bit line BL2 for the memory cell MC2 and the bit line BL3 for the memory cell MC3 is an array source ground line ASG. Arranged also between the bit line BL12 for the memory cell MC12 and the bit line BL13 for the memory cell MC13 is another array source ground line ASG.

The sources of the memory transistors MT of the respective memory cells are not only electrically interconnected one another, but also connected with the array source ground lines ASGs. Because these memories are EEPROMs, they are structurally interconnected by diffusion layers, which result in certain resistance R as shown in FIG. 6.

In reading out the data stored in such memory cells MC0–MC15, word lines WL are set to a high potential level H to turn on the selection transistors ST, and a required gate potential is applied to the control gates of the respective memory transistors MT through the sense line SL. Then the reading currents I that flow through the respective bit lines BL0–BL15 are determined, that is, the data are read, by the sense amplifiers by grounding the array source ground lines ASG.

In the embodiment shown in FIG. 6, a 16-bit word is partitioned into four groups that can be read out at a time. Reading a memory cell results in a voltage drop across the resistance R as determined by the reading current I. Consequently, if the 16 bit memory cells MC0, MC1, MC2, ... MC15 are simply partitioned into k groups from one end thereof in the order mentioned, memory cells remote from the array source ground lines ASG suffer excessive voltage drops by the resistors involved and hence excessive rises of the source potentials of the memory transistors MT. Such rise of the source potential will cause depletion of the memory cell current, thereby spoiling the read operation.

In the embodiment shown in FIG. 6, therefore, n (16) bit memory cells are partitioned into k (4) groups in such a way that the memory cells to be read simultaneously are dispersively distributed with respect to the array source ground lines ASG. More specifically, a first group includes memory cells MC0, MC4, MC8, and MC12; a second group, MC1, MC5, MC9, and MC13; a third group, MC2, MC6, MC10 and MC14; and a fourth group, MC3, MC7, MC11, and MC15, as shown in FIG. 6.

In reading data from the first group of memory cells (MC0, MC4, MC8, and MC12) for example, currents I will flow through the bit lines BL0, BL4, BL8, and BL12 in the directions indicated by arrows as shown in FIG. 6. It is seen in this example that the currents through all the selected memory cells are the same.

In other words, currents are spread with respect to the array source ground lines ASG so that currents I are least superposed in the resistors involved, thereby reducing rises of the source potentials of the memory transistors MT. Accordingly, read operations are faster and the reliability of the sense amplifiers is improved.

In the embodiments described and shown above, only two array source ground lines ASG are presented. However, there can be provided only one array source ground line or more than two array source ground lines in the serial storage device. It will be apparent for a person skilled in the art that the number of word bits is not limited to 16, and can be any number desired.

What we claim is:

1. A serial storage device, comprising:
   at least one memory cell array addressable in multiple n-bit memory cells:
      selection means for partitioning said n-bit memory cells into k ($k \geq 2$) groups of n/k-bit memory cells and for selecting said n/k-bit memory cell groups in sequence:
         n/k sense amplifiers for determining the data retrieved from the n/k-memory cells selected by said selection means; and
         a register for parallelly receiving the outputs of said sense amplifiers and for serially outputting them as readout data, and
      adapted to perform cell addressing of the memory cells of said memory cell array by a column selection signal and a row selection signal;
      wherein said selection means includes a first selector for selecting, from the row selected by said row selection signal, n-bit memory cells addressed by said column selection signal, and a second selector for partitioning said n-bit memory cells into n/k-bit groups ($k \geq 2$) and for sequentially selecting said n/k-bit groups;
         wherein, while said register is serially outputting said readout data, said second selector selects n/k bit data to be output next; and
         said n/k sense amplifiers determine said next n/k bit data;
      wherein
         each of said memory cells is an electrically writable and erasable non-volatile memory connected with at least one array source ground line which is common to said n-bit memory cells; and
         said n/k memory cells are dispersively distributed with respect to said at least one array source ground line.

2. A serial storage device, comprising:
   at least one memory cell array addressable in multiple n-bit memory cells:
      selection means for partitioning said n-bit memory cells into k ($k \geq 2$) groups of n/k-bit memory cells and for selecting said n/k-bit memory cell groups in sequence:

n/k sense amplifiers for determining the data retrieved from the n/k-memory cells selected by said selection means; and a register for parallelly receiving the outputs of said sense amplifiers and for serially outputting them as readout data, and adapted to perform cell addressing of the memory cells of said memory cell array by a column selection signal and a row selection signal;

wherein said selection means includes a first selector for selecting, from the row selected by said row selection signal, n-bit memory cells addressed by said column selection signal, and a second selector for partitioning said n-bit memory cells into n/k-bit groups ($k \geq 2$) and for sequentially selecting said n/k-bit groups, and further comprising a latch for latching therein n-bit data by sequentially latching externally supplied n/k-bit data in the locations of said latch selected by said second selector, said latch adapted to write said latched n-bit data to said addressed memory cells via said first selector;

wherein while said register is serially outputting said readout data, said second sector selects n/k bit data to be output next; and said n/k sense amplifiers determine said next n/k bit data; and wherein each of said memory cells is an electrically writable and erasable non-volatile memory connected with at least one array source ground line which is common to said n bit memory cells; and said n/k memory cells are dispersively distributed with respect to said at least one array source ground line.

3. A serial storage device, comprising:

at least one memory cell array addressable in multiple n-bit memory cells:

selection means for partitioning said n-bit memory cells into k ($k \geq 2$) groups of n/k-bit memory cells and for selecting said n/k-bit memory cell groups in sequence:

n/k sense amplifiers for determining the data retrieved from the n/k-memory cells selected by said selection means; and a register for parallelly receiving the outputs of said sense amplifiers and for serially outputting them as readout data; and adapted to perform cell addressing of the memory cells of said memory cell array by a column selection signal and a row selection signal wherein said selection means is adapted to select, from the row selected by said row selection signal, an n-bit memory cells addressed by said column selection signal to partition said n-bit memory cells into n/k-bit groups ($k \geq 2$) and for sequentially selecting said n/k-bit groups;

wherein, while said register is serially outputting said readout data, said selection means select n/k bit data to be output next; and said n/k sense amplifiers determine said next n/k bit data; and wherein each of said memory cells is an electrically writable and erasable non-volatile memory connected with at least one array source ground line which is common to said n bit memory cells; and said n/k memory cells are dispersively distributed with respect to said at least one array source ground line.

4. A serial storage device, comprising:

at least one memory cell array addressable in multiple n-bit memory cells:

selection means for partitioning said n-bit memory cells into k ($k \geq 2$) groups of n/k-bit memory cells and for selecting said n/k-bit memory cell groups in sequence:

n/k sense amplifiers for determining the data retrieved from the n/k-memory cells selected by said selection means; and a register for parallelly receiving the outputs of said sense amplifiers and for serially outputting them as readout data, and adapted to perform cell addressing of the memory cells of said memory cell array by a column selection signal and a row selection signal;

wherein said selection means is adapted to select, from the row selected by said row selection signal, an n-bit memory cells addressed by said column selection signal to partition said n-bit memory cells into n/k-bit groups ($k \geq 2$) and for sequentially selecting said n/k-bit groups;

further comprising a page buffer for holding externally supplied n/k-bit data in the j word locations of said buffer selected by said selection means, said page buffer adapted to write the whole data in said j word locations to addressed j word memory cells of said memory cell array via said selection means where $j \geq 1$;

wherein, while said register is serially outputting said readout data, said second selector selects n/k bit data to be output next; and said n/k sense amplifiers determine said next n/k bit data; and wherein each of said memory cells is an electrically writable and erasable non-volatile memory connected with at least one array source ground line which is common to said n bit memory cells; and said n/k memory cells are dispersively distributed with respect to said at least one array source ground line.

* * * * *